United States Patent [19]
Weber et al.

[11] Patent Number: 5,992,431
[45] Date of Patent: Nov. 30, 1999

[54] DEVICE FOR TREATING SUBSTRATES IN A FLUID CONTAINER

[75] Inventors: Martin Weber, Bad Dürrheim; John Oshinowo, Schwennigen, both of Germany

[73] Assignee: STEAG MicroTech GmbH, Pliezhausen, Germany

[21] Appl. No.: 09/056,586

[22] Filed: Apr. 7, 1998

Related U.S. Application Data

[62] Division of application No. 08/762,199, Dec. 6, 1996.

[51] Int. Cl.⁶ ................................................. B08B 3/10
[52] U.S. Cl. ..................... 134/135; 134/155; 134/184; 134/902; 134/186
[58] Field of Search .................... 134/186, 155, 134/184, 902, 135; 211/41.18, 41.17

[56] References Cited

U.S. PATENT DOCUMENTS

| | | |
|---|---|---|
| 3,964,957 | 6/1976 | Walsh . |
| 4,574,950 | 3/1986 | Koe et al. . |
| 4,676,008 | 6/1987 | Armstrong . |
| 4,858,764 | 8/1989 | Domokos . |
| 5,012,935 | 5/1991 | Aigo . |
| 5,149,244 | 9/1992 | Webber et al. . |
| 5,503,173 | 4/1996 | Kudo et al. . |
| 5,626,159 | 5/1997 | Erk et al. . |
| 5,672,212 | 9/1997 | Manos . |

FOREIGN PATENT DOCUMENTS

| | | |
|---|---|---|
| 3-116731 | 5/1991 | Japan . |
| 3-231428 | 10/1991 | Japan . |
| 5-190525 | 7/1993 | Japan . |

*Primary Examiner*—Frankie L. Stinson
*Attorney, Agent, or Firm*—Robert W. Becker & Associates

[57] ABSTRACT

A device for treating substrates includes a fluid container in which the substrates are contained during treatment. A nozzle system is connected to the sidewalls and/or bottom of the fluid container and includes a plurality of nozzles for introducing a fluid into the fluid container.

13 Claims, 2 Drawing Sheets ary application of Ser. No. 08/762,199 filed Dec. 6, 1996, the disclosure of which is herewith incorporated by reference.

DEVICE FOR TREATING SUBSTRATES IN A FLUID CONTAINER

This application is a division

BACKGROUND OF THE INVENTION

The present invention relates to a device for treating substrates in a fluid container.

Devices of this kind are, for example, known from U.S. Pat. 5,275,184 or from German Patent Application 44 13 077. In these devices a fluid is introduced via an inlet opening, respectively, a diffusor, into the fluid container and flows out via an overflow at the upper end of the fluid container. When using a single inflow opening at the bottom of the fluid container, the amount of fluid per time unit entering the fluid container as well as the velocity of the fluid flowing into the container is limited. Especially, it is not possible to achieve within the fluid container uniform flow conditions in order to uniformly supply the substrates or wafers contained within the fluid container for treatment across the entire substrate width or surface with the fluid. When using a diffusor, it is possible to distribute the inflowing fluid within the fluid container more evenly across the substrate surfaces, however, the amount of fluid flowing into the fluid container per time unit and especially the inflow velocity of the fluid is greatly limited when using diffusors.

It is therefore an object of the present invention to provide a device for treating substrates in a fluid container which allows for optimal flow conditions within the fluid container and which also allows for great throughput, respectively, flow velocities.

SUMMARY OF THE INVENTION

A device for treating substrates according to the present invention is primarily characterized by:

A fluid container in which the substrates are contained during treatment; and

A nozzle system connected to the fluid container and comprising a plurality of nozzles for introducing a fluid into the fluid container.

Advantageously, at least some of the nozzles have different spray angles.

At least one of the nozzles has a fan-shaped spray or, in the alternative, a cone-shaped spray.

The fluid container preferably has a first bottom and the nozzles are connected to the first bottom.

The nozzles may be arranged in a matrix on the first bottom.

Advantageously, the nozzles are arranged in different areas of the first bottom.

The nozzles may be arranged in nozzle groups. The different areas include a central area and a first and second lateral areas. The first one of the nozzle groups is preferably positioned in the central area, a second nozzle group is preferably positioned in the first lateral area, and a third nozzle group is preferably arranged in the second lateral area.

The device may further comprise fluid supply systems, wherein at least some of the nozzle groups are connected to separate ones of the fluid supply systems.

Individual ones of the nozzles are preferably connected to separate ones of the fluid supply systems.

The device may also further comprise fluid supply systems wherein at least some of the nozzles are connected to separate ones of the fluid supply systems.

The container may comprise a first bottom and a fluid supply chamber, positioned below the first bottom, wherein the nozzles are connected to the fluid supply chamber.

The fluid supply chamber is divided into a plurality of fluid compartments and each one of the fluid compartments is connected to one of the nozzles.

The fluid supply chamber is divided into a plurality of fluid compartments. The nozzles are arranged in nozzle groups. Each one of the fluid compartments is preferably connected to one of the nozzle groups.

In another embodiment of the present invention the fluid supply chamber is divided into a plurality of fluid compartments and some of the nozzles are arranged in nozzle groups. Some of the fluid compartments are separately connected to the nozzle groups and some of the fluid compartments are connected separately to individual ones of the nozzles.

The fluid container may comprise a second bottom and the fluid supply chamber is located between the first and the second bottoms.

The fluid container may comprise flushing openings for flushing the nozzles.

The fluid container has preferably a first bottom and the flushing openings are distributed in a matrix within the first bottom.

The flushing openings are arranged between the nozzles.

The fluid container may comprise a first bottom and a fluid supply chamber positioned below the first bottom. The flushing openings are preferably connected to the fluid supply chamber.

The fluid supply chamber may have a slanted chamber bottom. The first bottom is preferably slanted downwardly toward the center thereof. The fluid container may also comprise an outlet for quickly draining the fluid from the fluid container. The device may further comprise a basin for catching the fluid quickly drained from the fluid container.

The fluid container has sidewalls and the nozzles are preferably connected to the sidewalls. The nozzles are positioned at an upper area of the fluid container within the sidewalls.

The nozzle supply different fluids. At least some of the nozzles are arranged in nozzle groups and the nozzles and nozzle groups are provided for different fluids, respectively.

The device may further comprise separate supply lines for supplying the different fluids to the nozzle groups.

The device may further comprise separate supply lines for supplying the different fluids to the nozzles.

At least one diffusor for supplying at least one additional fluid to the fluid container may be provided within the device. The additional fluid may be a chemical, a gas, ozone and/or water.

The nozzle preferably injects chemicals into the fluid container between individual treatments.

The present invention also relates to another device for treating substrates, characterized according to the present invention primarily by:

A fluid container in which the substrates are contained during treatment; and

A substrate receiving device mounted within the fluid container and comprising three securing areas for securing the substrates.

The device may further comprise means for lifting and lowering the substrate receiving device.

Preferably, at least one of the securing areas is a knife-shaped stay having a longitudinal extension and having slots extending transverse to the longitudinal extension for receiving edge areas of the substrates.

At least one of the securing areas is vertically displaceable relative to at least one other of the securing areas.

In another embodiment, the inventive device may also be characterized by the following features:

A fluid container in which the substrates are contained during treatment;

The fluid container may comprise sidewalls;

At least one of the sidewalls has an inner surface with guides for the substrates;

A substrate receiving device mounted within the fluid container and comprising a securing area for securing the substrates is provided.

Preferably, the guides may be in the form of slots, stays, pins and/or knobs.

The sidewalls can have inner surfaces free of the guides.

The inner surfaces free of the guides and the inner surfaces with guides for the substrates are staggered relative to one another.

The inner surfaces that are free of the guides comprise at least one treatment element such as inlet openings, spray nozzles, diffusors, UV light sources and/or megasound generators.

Advantageously, the device comprises a cover for covering the fluid container.

The substrate receiving device may comprise at least one substrate securing stay resting on an upper edge of the substrates.

The device may further comprise a hood removably positioned on top of the fluid container.

The hood may comprise at least one fluid inlet.

The fluid introduced through the fluid inlet of the hood is provided for a drying treatment of the substrates according to the Marangoni method.

The device may further comprise a heating device for heating the fluid contained in the fluid container.

The device may further comprise, alone or in combination with the heating device, a cooling device for the fluid in the fluid container.

The device may further comprise a fluid treatment device.

The device may also further comprise a separator for removing alkaline and acidic vapors from exhaust gases of the device.

The device may include UV light sources, wherein the fluid container comprises a bottom and sidewalls and wherein the UV light sources are arranged at least at one of the bottom and the sidewalls.

The device may also comprise a megasound generating device.

The fluid container may comprise a bottom and sidewalls, wherein the bottom and the sidewalls define inner corners of the fluid container and wherein the megasound generating device is positioned within the inner corners.

The device may include a device for rotating the substrates within the fluid container.

According to the present invention, a nozzle system with a plurality of nozzles for introducing a fluid into the fluid container is provided. By providing a plurality of nozzles, it is possible to introduce the fluid with the desired flow conditions, respectively, in order to achieve the desired flow conditions within the fluid container so that the entire substrate surfaces to be treated are subjected to a uniform flow of the fluid. By using nozzles for introducing the fluid it is also possible to introduce and allow the fluid to flow with high inflowing velocity and high throughput velocity per time unit into and within the fluid container so that, by maintaining a laminar flow, extremely high flow velocities can be achieved. This not only improves the treatment of the substrates but also reduces the amount of time required for the treatment process so that the productivity of the device is increased.

According to another advantageous embodiment of the invention, at least some nozzles have different spray angles. The shape of the spray of the nozzles can be cone-shaped but also fan-shaped so that the introduction of the fluid, depending on the requirements of the individual treatment process and the position of the nozzles, can be optimized with respect to a uniform, laminar flow within the fluid container and a uniform treatment of the substrates with fluid.

The nozzles are preferably arranged at the bottom of the fluid container and, according to an especially advantageous embodiment, are distributed in a matrix. In this manner, a uniform distribution of the fluid supply over the entire bottom surface of the fluid container is possible, and it is especially possible to provide optimal flow conditions within the edge areas.

The nozzles are advantageously combined in nozzle groups which are preferably arranged at different bottom areas of the container. Advantageously, one nozzle group is arranged at the central area of the bottom and respective further nozzle groups are arranged within the lateral portions of the bottom whereby the density and number of nozzles within the individual areas can be different. Advantageously, the individual nozzles and/or nozzle groups may be provided with separate fluid supply systems so that the nozzles can be supplied with different fluid pressure.

According to another advantageous embodiment of the invention, below the bottom of the fluid container a fluid supply chamber is provided that is in connection (communication) with the nozzles. The fluid supply chamber according to a further embodiment of the invention is preferably divided into fluid compartments for individual nozzles and/or nozzle groups.

The fluid supply chamber below the bottom of the container is advantageously in the form of an intermediate space between a double bottom.

According to another advantageous embodiment of the invention, in addition to the nozzles, flushing openings for flushing the nozzles are provided which are advantageously also arranged in a matrix and positioned between the nozzles. In this manner, it is possible, to flush the intermediate spaces between the nozzles and also the dead angles present therebetween. The flushing openings advantageously communicate with the fluid supply chamber positioned therebelow in the same manner as the nozzles.

According to another embodiment of the invention, the bottom of the fluid container is slanted, preferably, the bottom slants toward its center, respectively, to a central line or a center point of the fluid container. In this manner, the fluid container, when releasing the fluid in a downward direction, can be quickly and completely emptied.

For quickly removing the fluid, a closeable opening is provided within the fluid container, especially at its center, respectively, center line. This fluid outlet opening has a large diameter. In the case of a power outage, or any other irregularity, but also in connection with conventional method steps, it is possible in this manner to remove the substrates within the fluid container quickly from exposure to the treatment medium, for example, an etching substance. For receiving the fluid to be quickly removed it is preferable to provide below the fluid container a receptacle or basin for catching the fluid.

A further embodiment of the invention suggests that in addition to, or instead, of the nozzles at the container bottom nozzles are provided at the sidewalls of the fluid container in order to thus introduce the fluid laterally or in the area of the transition of the fluid bottom to the sidewalls into the fluid container. This further improves the flow velocities and the throughput volume is increased accordingly.

According to a further very advantageous embodiment of the invention, different nozzles and/or nozzle groups are provided for different fluids. The individual nozzles and/or nozzle groups for different fluids are thus also separate with respect to their supply lines and pumps, so that the different fluids, for example, different chemicals, are introduced through nozzles and/or nozzle groups specific to the different chemicals. In this manner, a fluid exchange can be performed quickly and without the risk of intermixing because the respective fluids can only be supplied to the respective correlated nozzles.

According to a further very advantageous embodiment of the invention, in addition to the fluids introduced via the nozzles, further fluids, for example additional chemicals, gases, ozone, water etc. can also be introduced into the fluid container. Especially for the introduction of additional chemicals, gases, ozone, and/or water, at least one diffusor is provided within the fluid container.

In another advantageous embodiment of the invention, the spray nozzles at the upper area of the fluid container, preferably at the sidewalls, are provided to clean the fluid container and/or to wet, respectively, keep moist the substrates between different method steps performed within the same fluid container, for example, between the etching process, the cleaning process, and the drying process. For this purpose, aerosols, water, other chemical vapors etc. are introduced, but also fluids that can be introduced from the bottom into the fluid container.

The object of the present invention has been solved in connection with the aforementioned features as well as independent therefrom in regard to the fluid container having a substrate receiving device which comprises three securing areas for securing the substrate. By securing the substrates at three different locations, a defined position of the substrate is ensured without requiring guides within the fluid container. The substrate receiving device is advantageously liftable and lowerable, i.e., reciprocates vertically. Advantageously, at least one securing area is a knife-shaped stay that is provided with slots transverse to the longitudinal direction of the stay for receiving the edge portions of the substrates. Preferably, at least one securing area is vertically movable (displaceable) relative to at least one other securing area. In order to avoid repetition, with respect to this feature reference is made to German Patent application 196 15 108 and German Patent application 195 46 990, the disclosure of which are incorporated by reference into this specification.

According to a further very advantageous embodiment of the invention, the substrate receiving device has only one securing area, for example, in the form of a knife-shaped stay whereby within, respectively, at the inner surface of at least one sidewall of the fluid container guides for the substrates are provided. This embodiment has the advantage that in the fluid container for the substrate receiving device there is no or only a minimal space required so that the container volume and thus the chemical volume is small and the processing costs, which depend considerably on the use of chemicals, is capped at a low level. The guides are preferably formed by slots, more preferred however by stays, pins, and/or knobs. The latter have the advantage that they can be cleaned more easily and faster and, if required, can be dried. Upon displacement of a fluid with another fluid or upon changing the fluid within the container, slots, on the other hand will retain a lot of fluid and thus may contaminate the subsequently introduced fluid.

According to a further very advantageous embodiment of the invention, the inner surfaces of the sidewalls of the fluid container are provided with areas without guides. Without impeding the secure guiding and holding of the substrate within the fluid container, the areas of the inner surfaces without guides are staggered relative to the areas of the inner surfaces with guides. When, for example, in one area of the inner surfaces guides are provided, guides on the oppositely arranged inner surface are not required because guides on one side are sufficient to secure the substrates. In the areas of the inner surfaces without guides, preferably inlet openings, spray nozzles, diffusors, UV light sources and/or megasound generating devices are provided.

A further advantageous embodiment of the invention comprises a hood that can be placed onto and removed from the fluid container. The hood is preferably provided with a fluid inlet opening, especially for introducing a fluid for a drying method according to the Marangoni principle. In order to avoid repetition of these embodiments, reference is made to German Application 44 13 077 as well as German applications 195 00 239, 196 15 108 and 196 15 970.9, the disclosure of which is incorporated into this specification by reference.

Advantageously, a heating and/or cooling device for heating and/or cooling the fluid within the fluid container is provided with which the fluid temperature can be adjusted to a selected optimal value. The use of UV light sources is also advantageous. They may be arranged at the bottom and/or the sidewalls of the fluid container.

A further advantageous embodiment of the invention suggests the use of the substrate suppressing device, for example, in the form of a securing stay which can be placed onto the upper edge of the substrates. In order to avoid repetition reference is made to German application 196 15 970.9 of Apr. 22, 1996, the disclosure of which is incorporated by reference into the specification.

Advantageously, a megasound generating device, preferably in the form of a megasound transducer is integrated into the fluid container. An advantageous location for this device are the corners formed by the bottom and the sidewalls of the fluid container whereby the direction of sound emission is preferably 45° relative to the horizontal.

Since the inventive fluid container can be quickly filled and a strong nozzle effect results upon introduction of the fluid into the container, it is especially advantageous to provide a cover for the fluid container which prevents that fluid can splash onto the hood which is preferably used for the drying process.

The inventive device is preferably connected to a fluid treatment device in which the fluids or fluid mixtures are collected and treated so that they can be reused and preferably recycled into the fluid container.

Advantageously, a separating or removal device is provided with which alkaline and acidic vapors present within the exhaust gases are removed therefrom.

It is advantageous to be able to rotate the substrates within the fluid container especially during the treatment and flushing processes. For this purpose, a device is advantageously provided that rotates the substrates within the fluid container.

It is advantageous to premix the fluids, when using fluid mixtures, before introducing them into the fluid container.

BRIEF DESCRIPTION OF THE DRAWINGS

The object and advantages of the present invention will appear more clearly from the following specification in conjunction with the accompanying drawings, in which.

DESCRIPTION OF PREFERRED EMBODIMENTS

Figure 1:
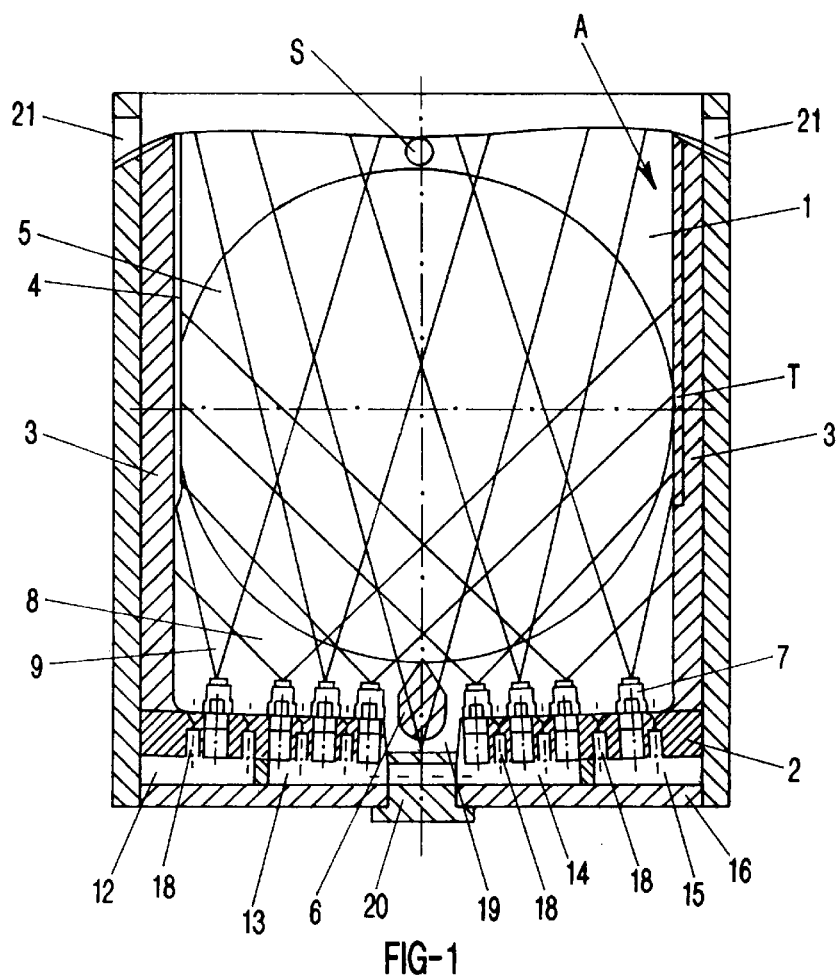
FIG. 1 shows one embodiment of the inventive device in cross-section.

The present invention will now be described in detail with the aid of several specific embodiments utilizing FIGS. 1 through 3.

As can be seen in the Figures, the fluid container 1 of the inventive device comprises a bottom 2 and sidewalls 3. On the opposed sidewalls 3 slots 4 are provided in which the substrate disks (wafers) 5 are guided. The inner surfaces of the sidewalls 3 of the fluid container are provided with areas A without guides. Without impeding the secure guiding and holding of the substrates 5 within the fluid container, the areas A of the inner surfaces without guides are staggered relative to the areas of the inner surfaces with guides (slots 4). When, for example, in one area of the inner surfaces guides (4) are provided, guides on the oppositely arranged inner surfaces are not required because guides (4) on one side are sufficient to secure the substrates 5. In the areas A of the inner surfaces without guides, treatment elements T (only schematically shown in FIG. 1) such as inlet openings, spray nozzles, diffusors, UV light sources and/or megasound generating devices are provided. The substrate disks 5 are supported by a substrate receiving device 6 which, with a non-represented drive, can be moved (reciprocated) in the vertical direction and can lower and lift the wafers 5 into and out of the fluid container 1. A securing stay S can be placed onto the upper edge of the substrates 5. The substrate receiving device 6 is comprised in the represented embodiment of a knife-shaped stay with slots or notches which are spaced so as to match the distance between the guide slots 4 within the oppositely arranged sidewall 3.

As can be seen best in FIG. 1, both sides of the bottom 2 are inwardly slanted toward a central line so that when emptying the fluid container 1 the fluid will flow towards the center and thus flow downwardly to empty the container.

Figure 3:
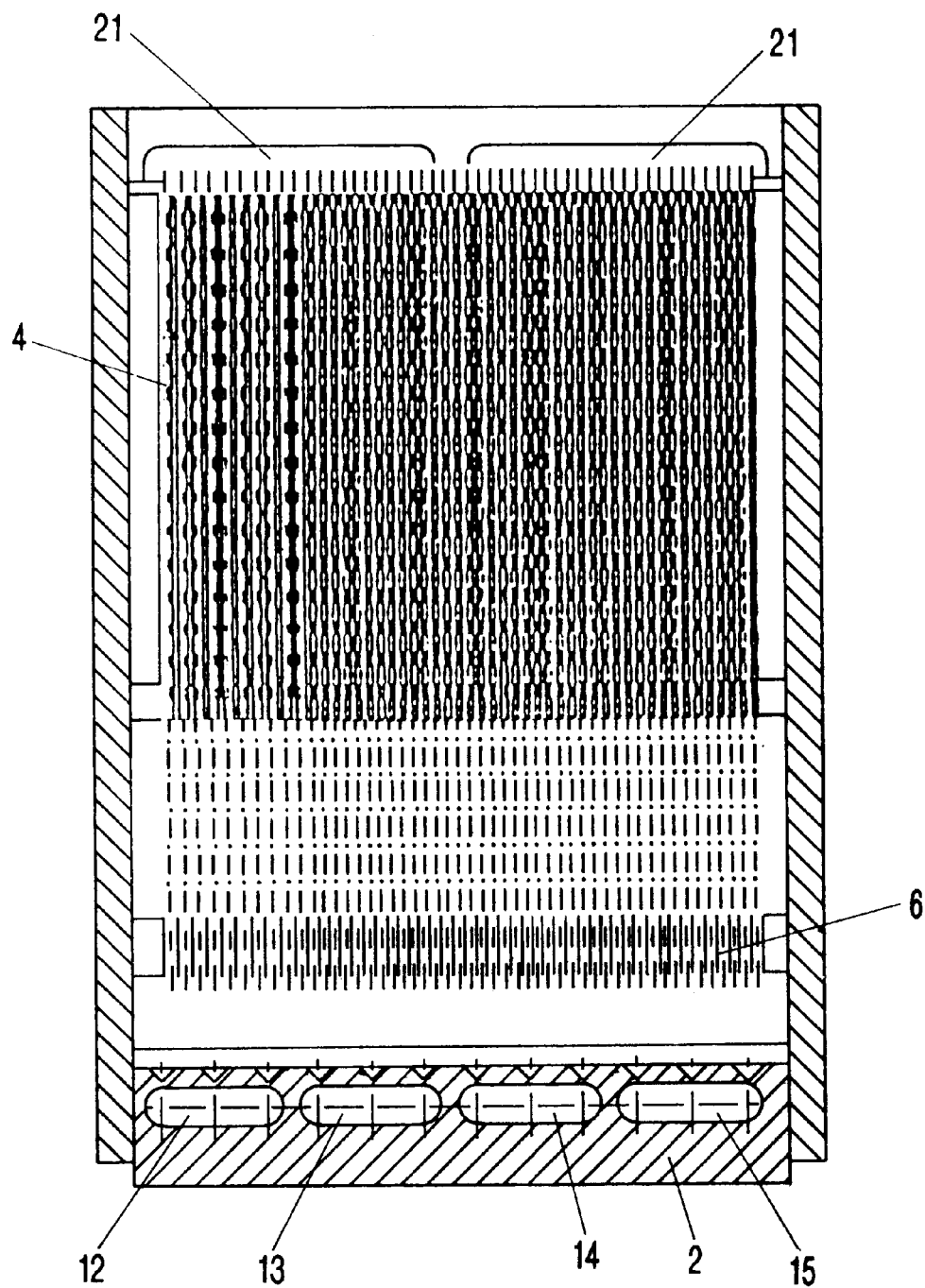
FIG. 3 shows a cross-sectional view along a section plane rotated by 90° relative to the section plane of FIG. 1.

The bottom 2 comprises a plurality of nozzles 7 which are arranged in a matrix as can best be seen in FIG. 3. The nozzles have different nozzle outlet angles, i.e., spray angles 8, 9 as is shown in FIG. 1. Due to the different spray angles, respectively, the different shape of the spray, an excellent uniform laminar flow results over the entire fluid container profile and the substrates 5 are thus uniformly loaded across their entire width by the fluid exiting from the nozzles 7.

As can be seen in FIG. 1, below the (first) bottom 2 hollow spaces 12, 13, 14, 15 forming a fluid supply chamber are provided which are closed off in the downward direction by a closure plate (second bottom) 16. The fluid is guided via the respective fluid compartments 12 to 15 through the respective nozzles 7 connected to the hollow spaces.

Figure 2:
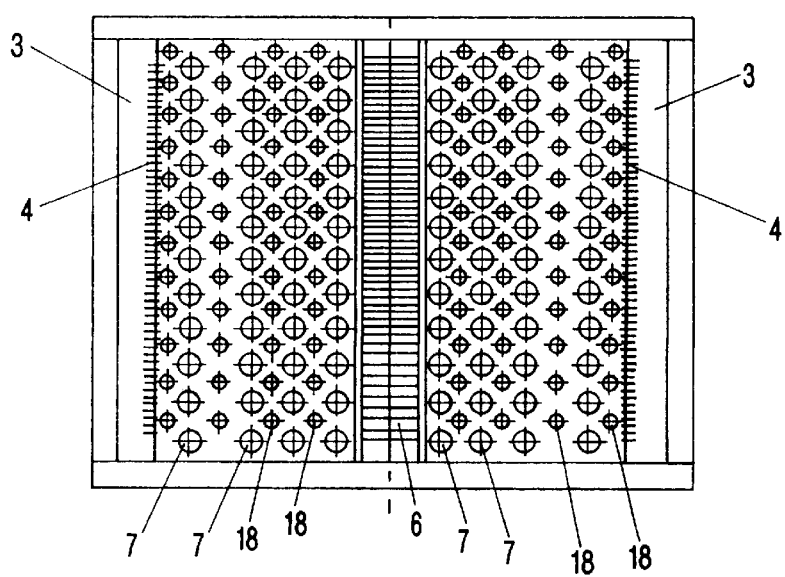
FIG. 2 shows the device of FIG. 1 in a plan view, i.e., viewed from the top into the fluid container, whereby, however, both sidewall are provided only with guides and not with a staggered treatment element/guide arrangement.

Between the nozzles 7 flushing openings 18 are provided within the bottom 2 which, as can be seen in FIG. 2, are also arranged in a matrix on the bottom 2 of the fluid container. The flushing openings 18 flush the area of the bottom 2 between the nozzles 7 and are also in connection with the fluid supply chamber (12 to 15) below the bottom 2 for supplying the liquid thereto.

As can be seen in FIG. 1, the center of the bottom 2 is provided with an opening 19 for allowing fast removal of the fluid from the fluid container 1, for example, when power outage occurs and/or the substrates 5 within the fluid container must be quickly removed from the fluid environment, for example, an etching medium, contained within the fluid container. Upon opening a closure 20 the fluid is emptied within a short period of time into a non-represented catch basin positioned below the fluid container 1.

The substrate receiving device 6 is positioned within the area above the closure 20 partially within the bottom 2 and extends only to a minimal amount above the nozzle openings in the upward direction. Thus, within the fluid container 1 only a minimal amount of additional space for the substrate receiving device is required so that the fluid volume within the fluid container 1 can be maintained at a low level.

At the upper area of the sidewalls 3 overflow openings 21 are provided via which the fluid entering the container from below can flow out.

The invention has been explained with the aid of a preferred embodiment. However, it is apparent to a person skilled in the art that numerous deviations and other embodiments are possible without deviating from the inventive concept. For example, it is possible to provide a hood above the fluid container 1 or it is possible to provide spray nozzles at the sidewalls 3 of the fluid container 1, for example, at the upper area for cleaning the container or for spraying the substrates 5 between the individual method steps and treatment processes. Also, the use of megasound transducers, UV light sources or devices for rotating the wafers 5 within the fluid container 1 are possible as has been mentioned above.

The present invention is, of course, in no way restricted to the specific disclosure of the specification and drawings, but also encompasses any modifications within the scope of the appended claims.

What we claim is:

1. A device for treating substrates, said device comprising:
    a fluid container in which the substrates are contained during treatment;
    said fluid container comprising sidewalls;
    at least one of said sidewalls having an inner surface with guides for the substrates;
    a substrate receiving device mounted within said fluid container and comprising a securing area for securing the substrates;
    wherein said sidewalls have inner surfaces free of said guides;
    wherein said inner surfaces free of said guides and said inner surface with guides for the substrates are staggered relative to one another.

2. A device according to claim 1, wherein said guides are selected from the group consisting of slots, stays, pins, and knobs.

3. A device according to claim 1, comprising a cover for covering said fluid container.

4. A device according to claim 1, wherein said substrate receiving device comprises at least one substrate securing stay resting on an upper edge of the substrates.

5. A device according to claim 4, further comprising a hood removably positioned on top of said fluid container.

6. A device according to claim 5, wherein said hood comprises at least one fluid inlet.

7. A device according to claim 6, wherein a fluid introduced through said fluid inlet of said hood is provided for a drying treatment of the substrates according to the Marangoni method.

8. A device according to claim 1, further comprising a heating device for heating the fluid contained in said fluid container.

9. A device according to claim 8, further comprising a cooling device for the fluid in said fluid container.

10. A device according to claim 1, further comprising a fluid treatment device.

11. A device according to claim 1, further comprising a megasound generating device.

12. A device for treating substrates, said device comprising:
- a fluid container in which the substrates are contained during treatment;
- said fluid container comprising sidewalls;
- at least one of said sidewalls having an inner surface with guides for the substrates;
- a substrate receiving device mounted within said fluid container and comprising a securing area for securing the substrates;
- wherein said sidewalls have inner surfaces free of said guides;
- wherein said inner surfaces free of said guides comprise at least one of the treatment elements selected from the group consisting of inlet openings, spray nozzles, diffusors, UV light sources, and megasound generators.

13. A device according to claim 12, wherein said inner surfaces free of said guides and said inner surface with guides for the substrates are staggered relative to one another.

* * * * *